United States Patent
Dede

(10) Patent No.: US 11,248,857 B2
(45) Date of Patent: Feb. 15, 2022

(54) SELF-ASSEMBLED OR RECONFIGURABLE STRUCTURES FOR HEAT FLOW CONTROL DEVICES

(71) Applicant: TOYOTA MOTOR ENGINEERING & MANUFACTURING NORTH AMERICA, INC., Plano, TX (US)

(72) Inventor: Ercan Mehmet Dede, Ann Arbor, MI (US)

(73) Assignee: Toyota Motor Engineering & Manufacturing North America, Inc., Plano, TX (US)

(*) Notice: Subject to any disclaimer, the term of this patent is extended or adjusted under 35 U.S.C. 154(b) by 176 days.

(21) Appl. No.: 16/435,704

(22) Filed: Jun. 10, 2019

(65) Prior Publication Data

US 2019/0293369 A1    Sep. 26, 2019

Related U.S. Application Data

(63) Continuation of application No. 14/659,671, filed on Mar. 17, 2015, now Pat. No. 10,330,400.

(51) Int. Cl.
*F28F 13/00* (2006.01)
*F28F 27/00* (2006.01)
(Continued)

(52) U.S. Cl.
CPC .......... *F28F 13/00* (2013.01); *F03G 7/06* (2013.01); *F28F 27/00* (2013.01); *H01F 7/00* (2013.01);
(Continued)

(58) Field of Classification Search
CPC ......... H05K 7/205; H01L 23/34; F28F 13/00; F28F 2013/005; F28F 2013/006; F28F 2013/008; F28F 2255/04
See application file for complete search history.

(56) References Cited

U.S. PATENT DOCUMENTS 6,278,607 B1 *  8/2001  Moore ................... G06F 1/203
                                                  361/679.54
6,330,157 B1   12/2001  Bezama et al.
(Continued)

FOREIGN PATENT DOCUMENTS

JP        61126000 A  *  6/1986
JP       2008117809 A  *  5/2008

OTHER PUBLICATIONS

NN82056373, Thermostatic Heat Sink, IBM Technical Disclosure Bulletin (Year: 1982).*
(Continued)

*Primary Examiner* — Eric S Ruppert
(74) *Attorney, Agent, or Firm* — Dinsmore & Shohl, LLP

(57) ABSTRACT

Devices configured to direct heat flow are disclosed, as well as methods of forming thereof. A device may include a self-assembling heat flow object. The self-assembling heat flow object may include a material having one or more self-assembling properties that cause the material to react to an environmental stimulus and one or more thermal pathways. An application of the environmental stimulus causes the self-assembling heat flow object to deploy and arrange the one or more thermal pathways for directing thermal energy to one or more locations.

17 Claims, 10 Drawing Sheets

(51) Int. Cl.
*H01F 7/00* (2006.01)
*H01L 23/36* (2006.01)
*H02S 40/40* (2014.01)
*F03G 7/06* (2006.01)
*H01L 23/34* (2006.01)
*H01F 7/20* (2006.01)
*H01L 41/12* (2006.01)

(52) U.S. Cl.
CPC ............. *H01L 23/34* (2013.01); *H01L 23/36* (2013.01); *H02S 40/40* (2014.12); *F03G 7/065* (2013.01); *F28F 2255/00* (2013.01); *F28F 2255/04* (2013.01); *F28F 2255/20* (2013.01); *F28F 2275/00* (2013.01); *F28F 2275/22* (2013.01); *F28F 2280/00* (2013.01); *H01F 7/206* (2013.01); *H01L 41/12* (2013.01)

(56) References Cited

U.S. PATENT DOCUMENTS

| | | | |
|---|---|---|---|
| 2008/0099193 A1* | 5/2008 | Aksamit | H01L 23/467 |
| | | | 165/300 |
| 2010/0246136 A1 | 9/2010 | Yu et al. | |
| 2011/0036538 A1 | 2/2011 | Brunschwiler et al. | |
| 2013/0008632 A1 | 1/2013 | Brunschwiler et al. | |
| 2014/0124739 A1 | 5/2014 | Deaton | |

OTHER PUBLICATIONS

E. Iwase et al., "A design method for out-of-plane structures by multi-step magnetic self-assembly," Sensors and Actuators, A 127 (2006), pp. 310-315.

M. T. Tolley et al., "Self-folding origami: shape memory composites activated by uniform heating," Smart Mater. Struct., vol. 23, No. 9 (2014).

* cited by examiner

SELF-ASSEMBLED OR RECONFIGURABLE STRUCTURES FOR HEAT FLOW CONTROL DEVICES

CROSS-REFERENCE TO RELATED APPLICATION

This application is a continuation of and claims priority to U.S. patent application Ser. No. 14/659,671, filed Mar. 17, 2015 and entitled "SELF-ASSEMBLED OR RECONFIGURABLE STRUCTURES FOR HEAT FLOW CONTROL DEVICES," the entire contents of which is incorporated herein by reference.

TECHNICAL FIELD

The present specification generally relates to thermal energy guiding systems and, more specifically, to thermal energy guiding systems that integrate self-assembling components.

BACKGROUND

A number of systems and devices emit thermal energy in various quantities and forms. For example, various vehicle components such as electronic components, hybrid motor systems, internal combustion engines, motors, electromechanical systems, and the like may emit thermal energy that must be dissipated to avoid system damage. Thus, it may be desirable to manage the emitted thermal energy such that it dissipates properly to avoid system damage. Illustrative systems and methods of managing the emitted thermal energy may include, but is not limited to, controlling dissipation to the surrounding environment and/or guiding the emitted thermal energy to a desired location, such as, for example, a location for harvesting the thermal energy. Such systems and methods may be costly to manufacture, as they require human intervention to ensure proper installation and placement.

Accordingly, a need exists for thermal energy guiding systems that are configured to self assemble without additional human intervention, thereby reducing manufacturing costs.

SUMMARY

In one embodiment, a self-assembling heat flow object includes a material having one or more self-assembling properties that cause the material to react to an environmental stimulus and one or more thermal pathways. An application of the environmental stimulus causes the self-assembling heat flow object to deploy and arrange the one or more thermal pathways for directing thermal energy to one or more locations.

In another embodiment, a method of forming a device configured to direct heat flow includes placing one or more materials having one or more of self-assembling properties on a substrate. The self-assembling properties cause the material to react to an environmental stimulus. The method also includes providing one or more thermal pathways and causing the environmental stimulus such that the material deploys and arranges the one or more thermal pathways for movement of heat at one or more locations adjacent to the device. Providing the one or more thermal pathways includes placing a thermally conductive material on the one or more materials In yet another embodiment, a device configured to direct heat flow includes a substrate, a shape memory material disposed on the substrate, and one or more thermal pathways. The shape memory material includes one or more self-assembling properties that cause the shape memory material to react to an environmental stimulus. An application of the environmental stimulus causes the device to deploy and arrange the one or more thermal pathways for directing thermal energy to one or more locations adjacent to the self-assembling heat flow object.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

The systems and methods described herein are generally directed to devices used for managing flow of thermal energy. For example, in some embodiments, the devices may be heat flow objects. In some embodiments, the heat flow objects may contain one or more features that are particularly arranged to direct heat, such as thermally conductive materials. In some embodiments, the heat flow objects may be coupled to a substrate. The heat flow objects described herein may generally include a self-assembling material such that, when activated, cause each of the heat flow objects to deploy, which may include, for example, changing shape, size, position, and/or configuration. Such a deployment may shift the heat flow objects from an undeployed state to a deployed state such that the heat flow objects are shaped and positioned to manage the flow of thermal energy in a particular manner. The ability to self-assemble may allow the heat flow objects to be installed with little or no human intervention, thereby increasing accuracy of placement and reducing manufacturing costs.

A "heat flow object" refers generally to an object that may be used to direct the flow of thermal energy. For example, in some embodiments, the heat flow object may be used with or in conjunction with one or more other devices to evacuate thermal energy from various equipment, particularly heat generating equipment.

Figure 1:
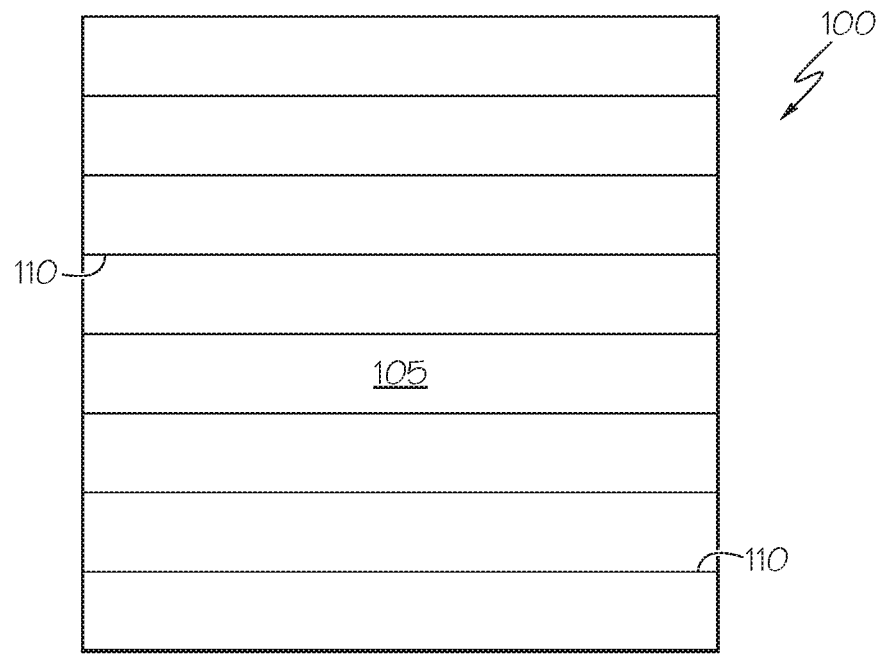
FIG. 1 depicts a first face view of an illustrative heat flow object containing a self-assembling material according to one or more embodiments shown and described herein.

As shown in FIG. 1, a heat flow object, generally designated 100, may have at least one surface 105 containing one or more thermal pathways 110 disposed thereon or integrated therewith. The one or more thermal pathways 110 may generally be any material, device, or element that conducts thermal energy and/or creates a heat flow path for movement of heat across the surface 105. In a nonlimiting example, a thermal pathway 110 may be a thermoconducting element containing a thermally conductive material, such as thermally conductive trace material or the like, that is configured to conduct thermal energy and direct the thermal energy in a particular direction. Illustrative thermally conductive materials may include, but are not limited to, copper, silver, aluminum, heat tubes, graphite, graphene, and/or the like. In some embodiments, the one or more thermal pathways 110 may be in an initial unarranged state and may transition to an arranged state when the heat flow object 100 transitions from an undeployed state to a deployed state, as described in greater detail herein. When arranged, the thermal pathways 110 may direct movement of thermal energy at one or more locations adjacent to the heat flow object 100, as described in greater detail herein.

In some embodiments, the heat flow object 100 may be used to divert thermal energy so that it is concentrated at a desired location. Thus, the heat flow object may be configured to assist in preventing overheating of the heat generating equipment. The heat flow object 100 may generally be any shape. Thus, the shape of the heat flow object 100 is not limited by the present disclosure. While the heat flow object 100 is shown as being generally square and having one surface in FIG. 1, it should be understood that the heat flow object may be any other shape and/or may have a plurality of surfaces without departing from the scope of the present disclosure. For example, in some embodiments, the heat flow object may be a bent or a curved structure having no discernible shape that is configured to flatten into a discernible shape in response to an environmental stimulus, as described in greater detail herein.

The heat flow object 100 may generally be any size. In some embodiments, the heat flow object 100 may be configured to change in size upon responding to an environmental stimulus, as described in greater detail herein. In some embodiments, the heat flow object 100 may be a nanostructure. A nanostructure is generally any structure that has an intermediate size between microscopic and molecular structures. As a nonlimiting example, the nanostructure has at least one dimension that is about 0.1 nanometers (nm) to about 100 nm. In some embodiments, the heat flow object 100 may be a microstructure. A microstructure is generally any structure that can only be revealed by a microscope above 25× magnification. As a nonlimiting example, the microstructure may have at least one dimension that is about 0.1 micrometers (μm) to about 100 μm.

In various embodiments, the heat flow object 100 may be configured to couple with one or more other heat flow objects, other non-heat flow objects, and/or devices. For example, in some embodiments, a plurality of heat flow objects 100 and or a plurality of other objects and devices may be configured to join together to form a single object. The object is not limited by this disclosure and may generally be any object. Illustrative objects may include, for example, heat flow chambers, heat flow tunnels, solids, Archimedean solids, and/or the like. A heat flow chamber may generally be a chamber configured to contain thermal energy. A heat flow tunnel may generally be a device configured to direct thermal energy from one end to another end. For example, the heat flow tunnel may be configured to direct thermal energy generated from a thermal energy source towards a device that is configured to dissipate or contain the thermal energy, such as the heat flow chamber. An Archimedean solid may generally be, for example any highly symmetric, semi-regular convex polyhedron composed of two or more types of regular polygons meeting in identical vertices.

Figure 2A:
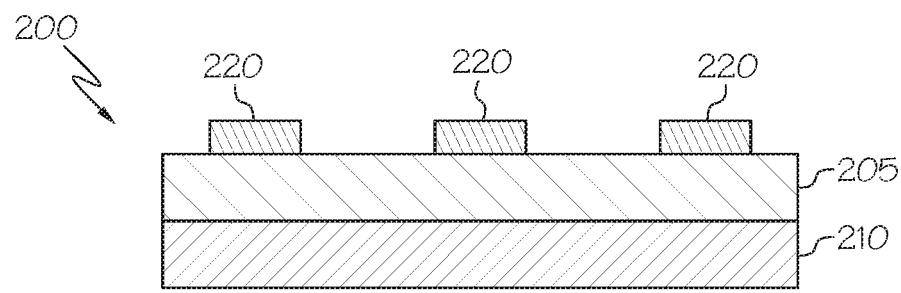
FIGS. 2A and 2B depict cross-sectional views of an illustrative heat flow object containing the self-assembling material and a substrate according to one or more embodiments shown and described herein.
Figure 2B:
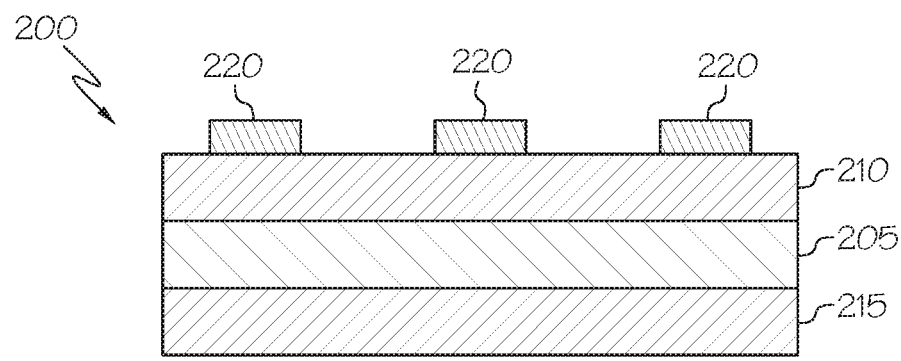

FIGS. 2A and 2B depict cross-sectional views of a heat flow object, generally designated 200, according to an embodiment. In some embodiments, the heat flow object 200 may include a material having one or more self-assembling properties 205 and a substrate 210, as shown in FIG. 2A. Such a material 205 may be referred to herein as a self-assembling material. In some embodiments, the heat flow object 200 may include the self-assembling material 205 and a plurality of substrates 210, 215, as shown in FIG. 2B. In some embodiments, the self-assembling material 205 may be affixed to a substrate 210, 215. In other embodiments, the self-assembling material 205 may be adjacent to a substrate 210, 215 or placed on a substrate. In some embodiments, the self-assembling material 205 may be sandwiched between a plurality of substrates 210, 215. In some embodiments, the heat flow object may also include one or more additional objects 220.

In various embodiments, at least a portion of the heat flow object 200 may be comprised of one or more materials. In particular embodiments, the self-assembling material 205 may include a plurality of self-assembling materials and the substrates 210, 215 may include a plurality of substrate materials. In some embodiments, at least a portion of the heat flow object 200, such as the self-assembling material 205, may be comprised of a material that reacts to an environmental stimulus, such as, for example, a change in a magnetic field, an introduction of an electrical current or field, a change in temperature, a change in illumination or exposure to varying waves of light, and/or the like. In some embodiments, the self-assembling material 205 may respond to a plurality of environmental stimuli. For example, an illustrative self-assembling material 205 may change its shape when exposed to a magnetic field and may also increase in size when illuminated. In some embodiments, the self-assembling material 205 may automatically self-assemble upon contact with the substrate material(s) 210, 215, as described in greater detail herein. In some embodiments, the self-assembling material 205 may provide the heat flow object with one or more self-assembling properties, as described in greater detail herein. For example, the self-assembling material 205 may be a particular amount of material, be positioned in a particular location, and/or the like to effect self-arrangement of the heat flow object 200 when exposed to the environmental stimulus. For example, in some embodiments, the self-assembling material 205 may be located only on one or more edges of the heat flow object 200.

In some embodiments, the self-assembling material 205 may be configured to react to a change in a magnetic field that is generally adjacent to the heat flow object 200. For example, the self-assembling material 205 may react when the heat flow object 200 is within a magnetic field. The self-assembling material 205 may generally react such that the heat flow object 200 and/or one or more components thereof rearranges and/or changes in shape or configuration when exposed to the magnetic field. Thus, in some embodiments, the heat flow object 200 and/or one or more components thereof may move, change in orientation, contact other objects and/or other heat flow objects, change in shape, and/or the like when exposed to the magnetic field. In particular embodiments, the heat flow object 200 may be configured such that it rearranges and/or changes shape or configuration in a controlled manner when exposed to the magnetic field. Thus, the heat flow object 200 may be configured to react in a predictable manner when exposed to the magnetic field. In some embodiments, the heat flow object 200 may be configured to react such that it self-assembles after it is created due to magnetic attraction or repulsion between various portions of the heat flow object.

Materials that react to a magnetic field may exhibit magnetic attraction or repulsion to one or more objects, thereby allowing the heat flow object 200 to move according to the magnetic attraction or repulsion. In a nonlimiting example, the heat flow object 200 may move toward an object (such as another heat flow object) when the materials exhibit magnetic attraction towards the object. In another nonlimiting example, the heat flow object 200 may move away from an object (such as another heat flow object) when materials exhibit magnetic repulsion towards the object. In some embodiments, materials that react to a magnetic field may cause the shape of the material (and therefore the heat flow object 200) to change. In a nonlimiting example, a heat flow object 200 containing one or more materials that may exhibit a magnetic attraction in a first location and a magnetic repulsion in a second location may cause a first portion of the heat flow object to move towards the first location and a second portion of the heat flow object to move away the second location, thereby altering the shape of the heat flow object. In some embodiments, materials that react to a magnetic field may initially be flexible, such as, for example, flexible nanotubes having polar ends. When placed in a magnetic field, the flexible nanotubes may straighten and align with the polar ends of the magnetic field such that the nanotubes are rigid.

Illustrative materials that react to a magnetic field may include, but are not limited to, ferromagnetic materials such as cobalt, iron, nickel, copper, chromium, manganese, europium, gadolinium, dysprosium, and the like, as well as combinations, compounds, and alloys thereof. Illustrative combinations, compounds, and alloys include, but are not limited to, iron (III) oxide, iron (II, III) oxide, nickel oxide, copper oxide, magnesium oxide, manganese bismuth, manganese antimonide, yttrium iron garnet, chromium dioxide, manganese arsenide, europium oxide, Permalloy® (Marigold Works, Birmingham Ala.), and/or the like. Permalloy® is an iron-nickel alloy that has about 20% by weight of iron and about 80% by weight of nickel. Other illustrative materials that react to a magnetic field may include, for example, diamagnetic materials and paramagnetic materials. Diamagnetic materials may generally be any material that creates an induced magnetic field in a direction that is opposite to an externally applied magnetic field, thereby repelling from the applied magnetic field. Illustrative diamagnetic materials may include, but are not limited to, water, wood, glass, ceramics, organic compounds such as petroleum, plastic, biological tissue, and metals such as copper, mercury, gold, and bismuth. Paramagnetic materials may generally be any material that is attracted by an externally applied magnetic field to form internal induced magnetic fields in the direction of the applied magnetic field. Illustrative paramagnetic materials may include, but are not limited to, cobalt, copper, nickel, platinum, magnesium, molybdenum, lithium gadolinium, dysprosium, terbium, and alloys and oxides thereof.

Other illustrative materials that react to a magnetic field may include, but are not limited to, magnetic shape memory alloys and magnetic shape memory polymers. A magnetic shape memory alloy may generally be any material which exhibits large strains under the influence of an applied magnetic field due to martensitic phase transformation. One illustrative magnetic shape-memory alloys is a nickel manganese gallium alloy (Ni2MnGa). Such an alloy exhibits a magnetic shape memory effect of up to 6% elongation in a magnetic field, an inverse magnetostrictive effect (Villari), a shape change caused by applying a magnetic field as well as a shape change is caused by temperature, and exhibits controlled spring properties. If the alloy is completely compressed or elongated, it may also exhibit a change in resistance. Such properties exhibited by magnetic shape memory alloys may be known as a shape memory effect. Thus, as shown, for example, in FIG. 6, the magnetic shape memory effect may be used for a heat flow object 600 that elongates based on the presence of a magnetic field. Such an elongation can be reversed fully either by the application of a magnetic field perpendicular to the original field.

In some embodiments, the self-assembling material 205 may be configured to react to an applied electrical current and/or an electrical field. The self-assembling material 205 may generally react such that the heat flow object 200 and/or one or more components thereof rearranges and/or changes in shape or configuration when the electrical current and/or electrical field is introduced. Thus, in some embodiments, the heat flow object 200 and/or one or more components thereof may move, change in orientation, contact other objects and/or other heat flow objects, change in shape, and/or the like when exposed to the electrical current and/or electrical field. In particular embodiments, the heat flow object 200 may be configured such that it rearranges and/or changes shape or configuration in a controlled manner when exposed to the electrical current and/or electrical field. Thus, the heat flow object 200 may be configured to react in a predictable manner when exposed to the electrical current and/or electrical field.

Materials that react to an applied electrical current and/or an electrical field may exhibit electromagnetic attraction or repulsion to one or more objects, thereby allowing the heat flow object 200 to move according to the electromagnetic attraction or repulsion. In a nonlimiting example, the heat flow object 200 may move toward an object (such as another heat flow object) when the materials exhibit electromagnetic attraction towards the object. In another nonlimiting example, the heat flow object 200 may move away from an object (such as another heat flow object) when materials exhibit electromagnetic repulsion towards the object. In some embodiments, materials that react to an applied electrical current and/or an electrical field may cause the shape of the material (and therefore the heat flow object 200) to change. In a nonlimiting example, a heat flow object 200 containing one or more materials that may exhibit an electromagnetic attraction in a first location and an electromagnetic repulsion in a second location may cause a first portion of the heat flow object to move towards the first location and a second portion of the heat flow object to move away the second location, thereby altering the shape of the heat flow object. In some embodiments, materials that react to a electrical field may initially be flexible, such as, for example, flexible nanotubes. When placed in an electrical field, the flexible nanotubes may straighten and align with the current produced by the electrical field such that the nanotubes are rigid.

Illustrative materials that react to an electrical current and/or electrical field may include, but are not limited to, metals, electrolytes, superconductors, semiconductors, non-metallic conductors, conductive polymers, shape memory polymers, shape memory alloys, and/or the like. An electric shape memory alloy may generally be any material which exhibits large strains under the influence of an applied electronic current and/or electric field.

In some embodiments, the self-assembling material 205 may be configured to react to a change in the temperature of an area adjacent to the heat flow object 200. The self-assembling material 205 may generally react such that the heat flow object 200 and/or one or more components thereof rearranges and/or changes in shape or configuration when the temperature change is introduced. Thus, in some embodiments, the heat flow object 200 and/or one or more components thereof may move, change in orientation, contact other objects and/or other heat flow objects, change in shape, and/or the like when exposed to an increased or decreased temperature. In particular embodiments, the heat flow object 200 and/or one or more components thereof may be configured such that it rearranges and/or changes shape or configuration in a controlled manner when exposed to temperature change. For example, the heat flow object 200 and/or one or more components thereof may be in a non-rigid, flexible orientation that becomes rigid and forms a particular shape when cooled. Thus, the heat flow object 200 may be configured to react in a predictable manner when exposed to the temperature change. In some embodiments, particularly embodiments where the heat flow object 200 is configured to direct heat from a heat source, the self-assembling material 205 may be configured so as to not react to a temperature change that is caused by the heat source. For example, the self-assembling material 205 may be made of a material that only reacts to temperature changes that are greater than or less than a range of temperatures generated by the heat source.

Illustrative materials that react to a change in temperature may include, but are not limited to, thermoplastic shape memory polymers and/or the like. Other illustrative materials that react to a change in temperature may include, but are not limited to, thermoset shape memory polymers such as crosslinked network polymers that possess a glass transition temperature and rubbery modulus and such that when the polymers are brought to a temperature above a glass transition temperature, the polymers can be deformed into a metastable state and cooled below the transition, at which point that metastable state can be fixed. Moreover, thermoset shape memory polymers may be reheated above the transition to recover the shape at a force proportional to the rubbery modulus.

In some embodiments, the self-assembling material 205 may be configured to react in response to illumination of the heat flow object 200. The self-assembling material 205 may generally react such that the heat flow object 200 and/or one or more components thereof rearranges and/or changes in shape or configuration when the heat flow object is illuminated with a particular photonic energy, such as a particular wavelength of light. Thus, in some embodiments, the heat flow object 200 and/or one or more components thereof may move, change in orientation, contact other objects and/or other heat flow objects, change in shape, and/or the like when exposed to a particular photonic energy. In particular embodiments, the heat flow object 200 and/or one or more components thereof may be configured such that it rearranges and/or changes shape or configuration in a controlled manner when exposed to a particular photonic energy. Thus, the heat flow object 200 may be configured to react in a predictable manner when exposed to the particular photonic energy.

In some embodiments, such light-reactive materials may be deformed and fixed into predetermined shapes via ultraviolet light illumination. In other embodiments, such light-reactive materials may be deformed and fixed into predetermined shapes via other wavelengths of light. An illustrative light-reactive material may be, for example, a light-activated shape memory polymer (LASMP). A LASMP may be formed via one or more photo-crosslinking and/or photo-cleaving processes to change a glass transition temperature ($T_g$). Photo-crosslinking may be achieved via a first wavelength of light, where a second wavelength of light reversibly cleaves the photo-crosslinked bonds. Accordingly, the material may be reversibly switched between an elastomer and a rigid polymer. Illustrative polymers may contain one or more cinnamic groups that can be fixed into predetermined shapes by ultraviolet (UV) light illumination (for example, greater than 260 nm) and then recover to an original shape when exposed to UV light of a different wavelength (for example, less than 260 nm). Illustrative cinnamic groups may include, but are not limited to, cinnamic acid and cinnamylidene acetic acid.

In various embodiments, the substrate 210, 215 may be made of any material, particularly materials commonly used for substrates. In some embodiments, the substrate 210, 215 may be a polymeric substrate containing one or more polymeric materials. In some embodiments, the substrate 210, 215 may have a plurality of components affixed thereto in addition to the self-assembling material 205. For example, the substrate 210, 215 may be a printed circuit board (PCB) or the like. The printed circuit board may be any printed circuit board now known or later developed, including single sided PCBs, double sided PCBs, and multi-layer PCBs. In some embodiments, the substrate 210, 215 may be a paper-based substrate containing one or more paper materials. Illustrative paper-based substrates may include, but are not limited to, paperboard, carton board, containerboard, cardboard, paper stock, laminated paper-based materials, and/or the like. In some embodiments, the substrate 210, 215 may be a high thermally conductive material. In some embodiments, the substrate 210, 215 may be a low thermally conductive material. In other embodiments, a first substrate 210 may be a high thermally conductive material and a second substrate 215 may be a low thermally conductive material. A high thermally conductive material may generally be a material that causes heat transfer at a higher rate than a low thermally conductive material. Thus, a high thermally conductive material may attract thermal energy and a low thermally conductive material may insulate from thermal energy. Illustrative high thermally conductive materials may include copper, aluminum, and silver. Illustrative low thermally conductive materials may include polystyrene and alumina.

In some embodiments, the one or more additional objects 220 may also be placed adjacent to the substrate 210, 215 and/or the self-assembling material 205. In particular embodiments, the one or more additional objects 220 may be disposed on the substrate 210, 215 and/or the self-assembling material 205 The one or more additional objects 220 are not limited by this disclosure and may be any object. For example, in some embodiments, the one or more additional objects 220 may be one or more solar cells that are integrated with the substrate 210, 215 and/or the self-assembling material 205. In another nonlimiting example, the one or more additional objects 220 may be thermal pathways, as described in greater detail herein.

In some embodiments, the placement of the self-assembling material 205 with respect to the substrate(s) 210, 215 and the one or more additional objects 220 may cause a reaction between the various layers. Illustrative reactions may include self-assembly, as described in greater detail herein. Accordingly, the resultant shape and size of the heat flow object 200 may be manipulated based on the properties of the various layers and the placement of the layers relative to one another.

Figure 3:
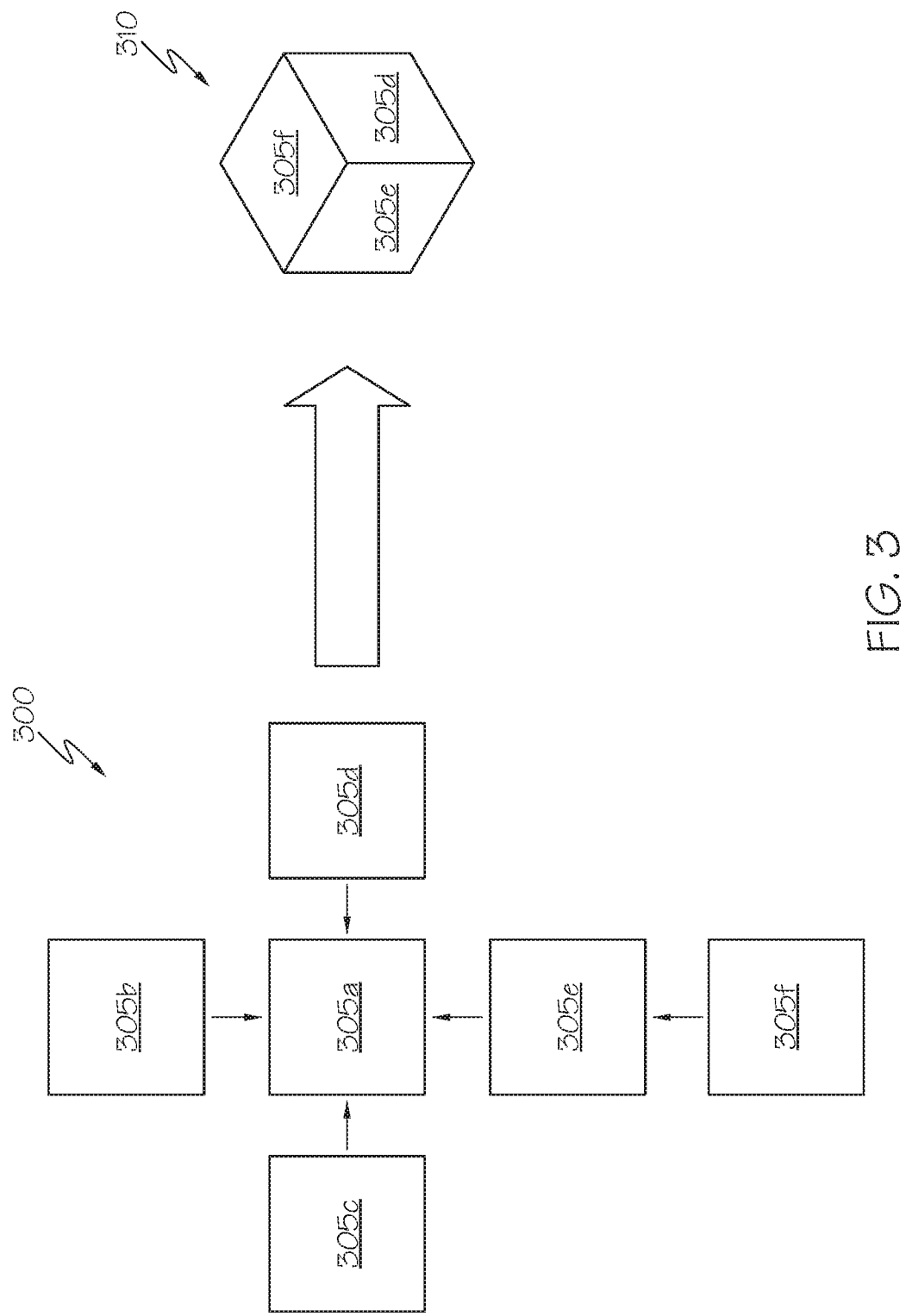
FIG. 3 depicts a schematic view of an illustrative arrangement of a plurality of heat flow objects in the presence of an environmental stimulus according to one or more embodiments shown and described herein.

FIG. 3 depicts a general schematic showing an assembly of a plurality of heat flow objects 305a-305f containing a self-assembling material when exposed to an environmental stimulus according to an embodiment. The schematic depicted in FIG. 3 may represent a general response to any environmental stimulus described herein. Thus, as shown in FIG. 3, when an environmental stimulus is applied to the plurality of heat flow objects 305a-305f in an undeployed state 300, the heat flow objects may rearrange and/or change in shape or configuration to a deployed state 310. The undeployed state 300 is not limited by this disclosure and may generally be any proximate arrangement of the plurality of heat flow objects 305a-305f. Likewise, the deployed state 310 is not limited by this disclosure and may generally reflect a particular intended arrangement of heat flow objects 305a-305f.

In some embodiments, the plurality of heat flow objects 305a-305f may be placed and/or connected in a monolayer in a general location relative to each other and/or other objects to ensure that when the environmental stimulus is introduced, the heat flow objects will automatically arrange in a desired deployed state 310. For example, a plurality of outer heat flow objects 305b-305e in an undeployed state 300 may be in general alignment around a central heat flow object 305a to form a general cross like arrangement such that, when the environmental stimulus is introduced, the outer heat flow objects join to the central heat flow objects and to each other in a generally cube shaped deployed state 310.

Figure 4:
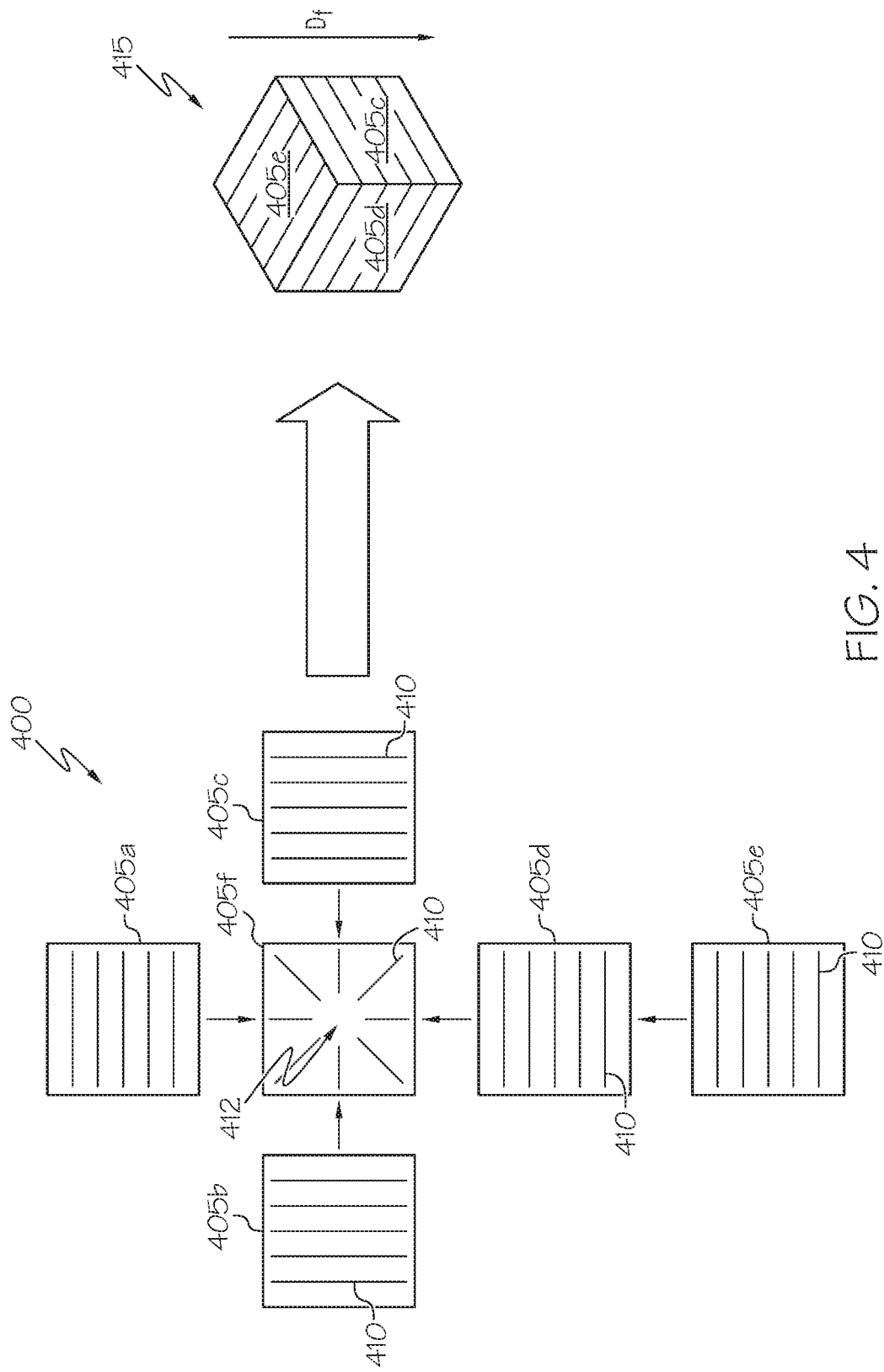
FIG. 4 depicts a schematic view of another illustrative arrangement of a plurality of heat flow objects in the presence of an environmental stimulus according to one or more embodiments shown and described herein.

FIG. 4 generally depicts a plurality of heat flow objects 405a-405f containing thermal pathways 410 during a transition from an undeployed state 400 to a deployed state 415. Deployment of the heat flow objects 405a-405f, whether due to an environmental stimulus or an automatic reaction between heat flow objects, may cause the heat flow objects to align such that the thermal pathways 410 are arranged to direct thermal energy in a particular manner. For example, the heat flow objects 405a-4005f may be arranged such that the thermal pathways 410 direct thermal energy in a flow direction $D_f$. The flow direction $D_f$, as shown in FIG. 4, may be towards a central area 412 located at the bottom of the heat flow objects in the deployed state 415. The central area 412 may be, for example, an area of concentration of heat, such as an area used to convert heat to other forms of energy or an area used to dissipate concentrated heat.

Figure 5A:
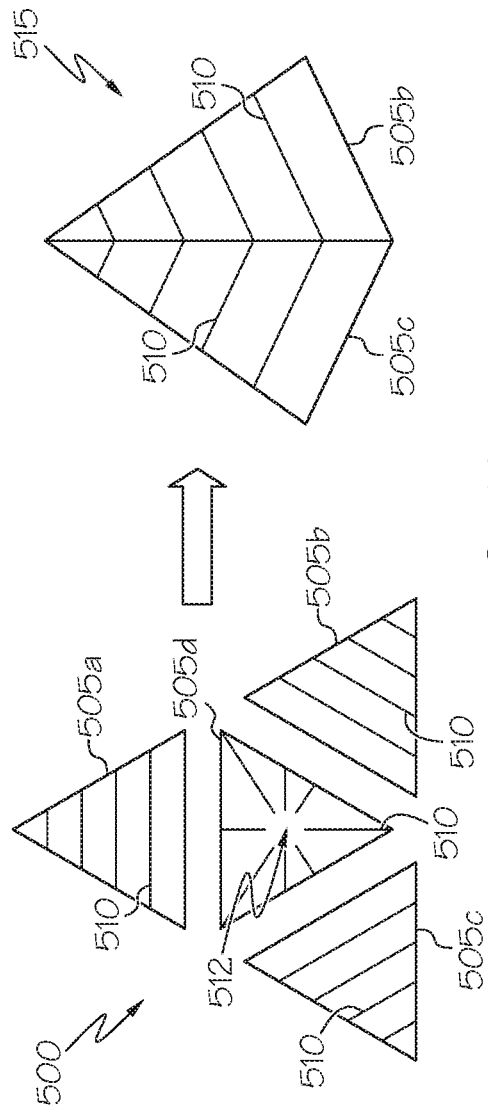
FIGS. 5A and 5B depict schematic views of other illustrative arrangements of a plurality of heat flow objects in the presence of an environmental stimulus according to one or more embodiments shown and described herein.
Figure 5B:
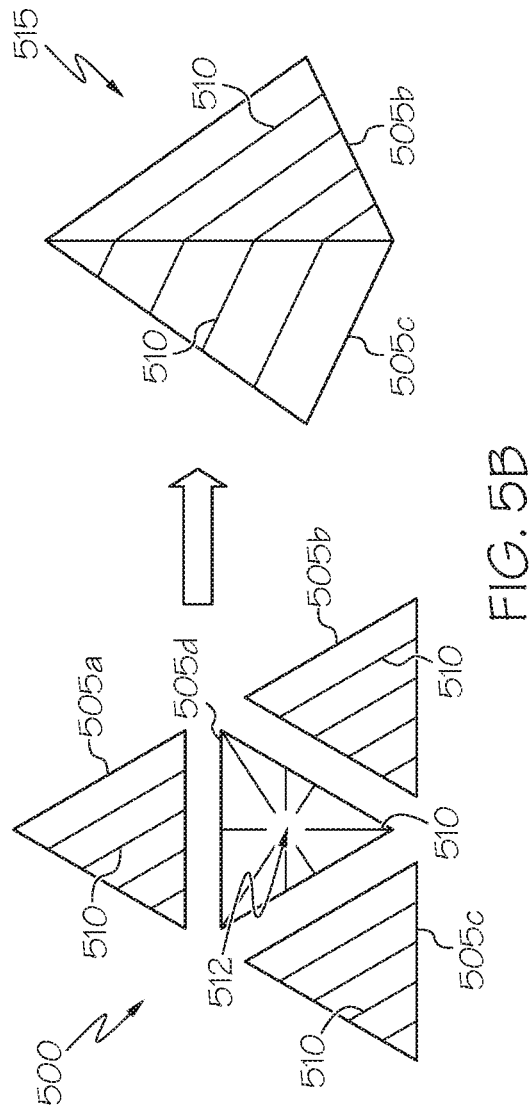

Similar to FIG. 4, FIGS. 5A and 5B also generally depict a plurality of heat flow objects 505a-505d containing thermal pathways 510 during a transition from an undeployed state 500 to a deployed state 515. The various arrangements of the thermal pathways 510 may cause differing thermal energy flows. For example, the deployed state 515 of the heat flow objects 505a-505d in FIG. 5A shows a substantially horizontal positioning of thermal pathways 510 for directing thermal energy. In contrast, the deployed state 515 of the heat flow objects 505a-505d in FIG. 5B shows a substantially horizontal thermoconducting element 510 arrangement on a first side of the shape and a substantially vertical positioning of thermal pathways on a second side of the shape. Accordingly, the thermal energy may flow in a first direction according to FIG. 5A and in a second direction according to FIG. 5B. In either arrangement, the thermal energy may generally flow towards the central area 512, as described herein.

Figure 6:
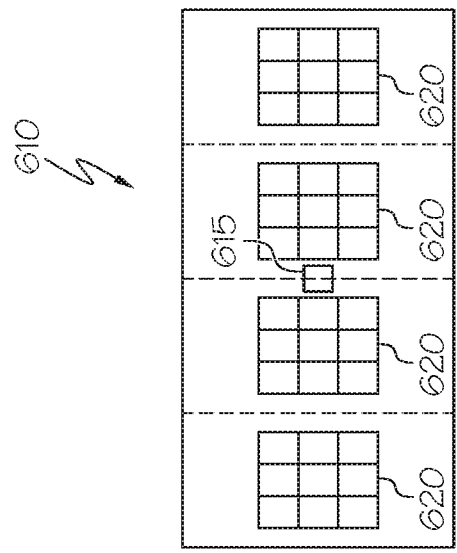
FIG. 6 depicts a schematic view of an illustrative change in a heat flow object in the presence of an environmental stimulus according to one or more embodiments shown and described herein.
Figure 6:
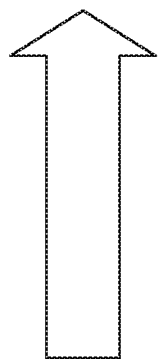
Figure 6:
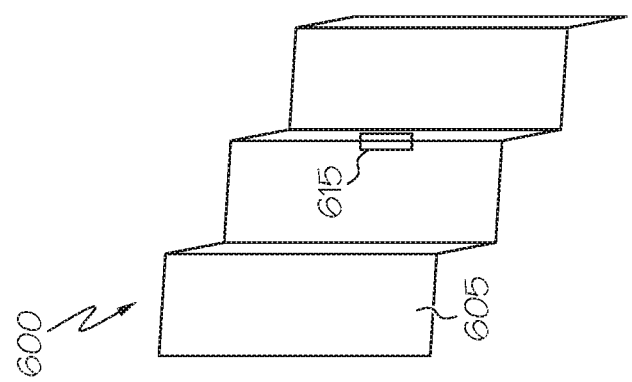

FIG. 6 generally depicts a transition of a heat flow object 605 from an accordion-shaped undeployed state 600 to a flattened deployed state 610. As shown in FIG. 6, the heat flow object 605, upon undergoing self-assembly, may automatically transition from the undeployed state 600 to the deployed state 610. Such a transition may include, for example, an expansion from a compact state to an uncompacted state, a contraction from an uncompacted state to a compact state, a change in the general shape of the heat flow object 605, a change in the general size of the heat flow object, and/or the like. As previously described herein, the heat flow object 605 may transition between undeployed 600 and deployed states 610 in response to an environmental stimulus, such as, for example, a thermal stimulus or an illumination stimulus.

In some embodiments, heating the heat flow object 605 to a particular temperature may cause the heat flow object to transition from the undeployed state 600 to the deployed state 610 and cooling the heat flow object below the particular temperature may return it from the deployed state to the undeployed state. In other embodiments, cooling the heat flow object 605 to a particular temperature may cause the heat flow object to transition from the undeployed state 600 to the deployed state and heating the heat flow object above the particular temperature may return it from the deployed state to the undeployed state. The particular temperature is not limited by this disclosure any may generally be any temperature that corresponds to a transition temperature of the materials used in the heat flow object 605, as described in greater detail herein.

In some embodiments, illuminating the heat flow object 605 with a first particular wavelength of light may cause the heat flow object to transition from the undeployed state 600 to the deployed state 610 and illuminating the heat flow object with a second particular wavelength of light may return it from the deployed state to the undeployed state. The first particular wavelength and the second particular wavelength are each not limited by this disclosure any may generally be any wavelength that corresponds to a transition wavelength of the materials used in the heat flow object 605, as described in greater detail herein.

In some embodiments, the heat flow object 605 may include solar cells 620 that form when the heat flow object arranges into the deployed state 610. The solar cells 620 are not limited by this disclosure and may generally include any photovoltaic cells that convert photon energy into electricity via a photovoltaic effect. In some embodiments, the heat flow object 605 may incorporate a temperature sensitive element 615. The temperature sensitive element 615 may generally be any device for sensing temperature, converting energy, and/or the like. In a nonlimiting example, the temperature sensitive element 615 may be a device, such as a resistor, that is commonly used in solar panels to assist in converting solar energy into electricity.

Figure 7:
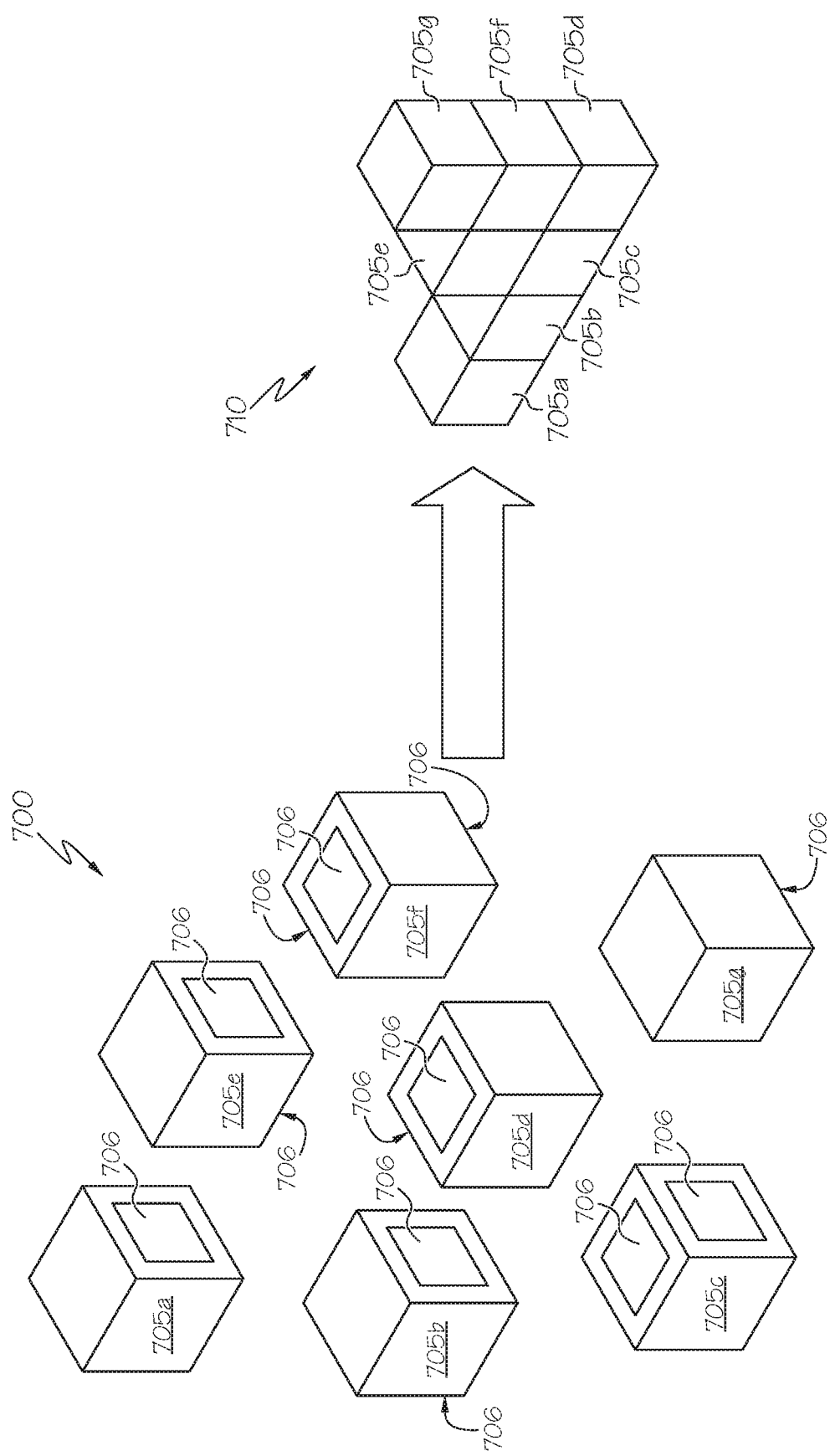
FIG. 7 depicts a schematic view of an illustrative arrangement of a plurality of heat flow objects in the presence of an environmental stimulus according to one or more embodiments shown and described herein.

FIG. 7 depicts rearrangement of a plurality of heat flow objects 705a-705g from a first state 700 to a second state 710 according to various embodiments. In some embodiments, the first state 700 may be an unarranged deployed state. In other embodiments, the first state 700 may be an undeployed state. In some embodiments, the second state 710 may be an arranged deployed state. In some embodiments, the second state may result in an electro-thermal wall, enclosure, or the like. Similar to the embodiments described herein with respect to FIGS. 3-6, the heat flow objects 705a-705g may transition to the first state 700 upon application of an environmental stimulus. In some embodiments, the heat flow objects 705a-705g may transition from the first state 700 to the second state 710 when at least a portion of a face 706 of a first heat flow object 705 exhibits attraction (for example, magnetic or electromagnetic) to at least a portion of a face of a second heat flow object to cause the two faces to join together. Some heat flow objects, such as, for example, heat flow object 705c, may contain a plurality of faces 706 that exhibit attraction to faces on corresponding heat flow objects such that they join together in a particular manner. Such an attraction between faces 706 may occur either in the presence or absence of an environmental stimulus.

Figure 8:
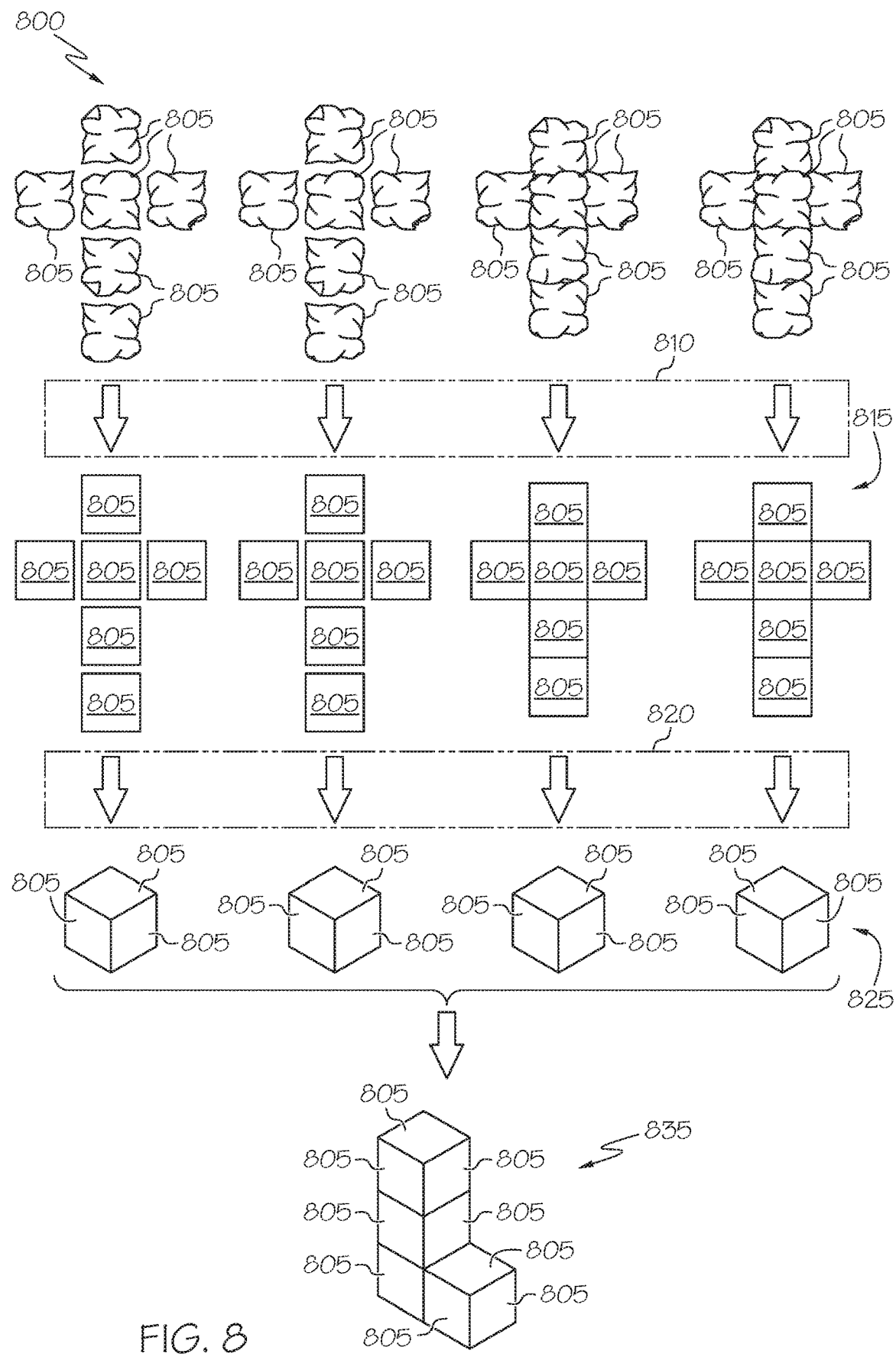
FIG. 8 depicts a schematic view of an illustrative multiple step arrangement of a plurality of heat flow objects in the presence of a plurality of environmental stimuli according to one or more embodiments shown and described herein.

In various embodiments, multiple stimuli may be used to arrange heat flow objects into a final deployed state. For example, FIG. 8 depicts an illustrative multiple step arrangement of a plurality of heat flow objects 805 in the presence of a plurality of environmental stimuli. As shown in FIG. 8, the heat flow objects 805 may first be in an undeployed state 800. At the application of a first environmental stimulus 810, such as any one of the environmental stimuli described in greater detail herein, the heat flow objects 805 may arrange into a first deployed state 815. At the application of a second environmental stimulus 820, such as any one of the environmental stimuli described in greater detail herein, the heat flow objects 805 may arrange into a second deployed state 825. At the application of a third environmental stimulus 830, such as any one of the environmental stimuli described in greater detail herein, the heat flow objects 805 may arrange into a third deployed state 835. Arrangement into the third deployed state 835 may be in a manner similar to which is described herein with respect to FIG. 7. In some embodiments, the third deployed state may be a final deployed state.

Figure 9:
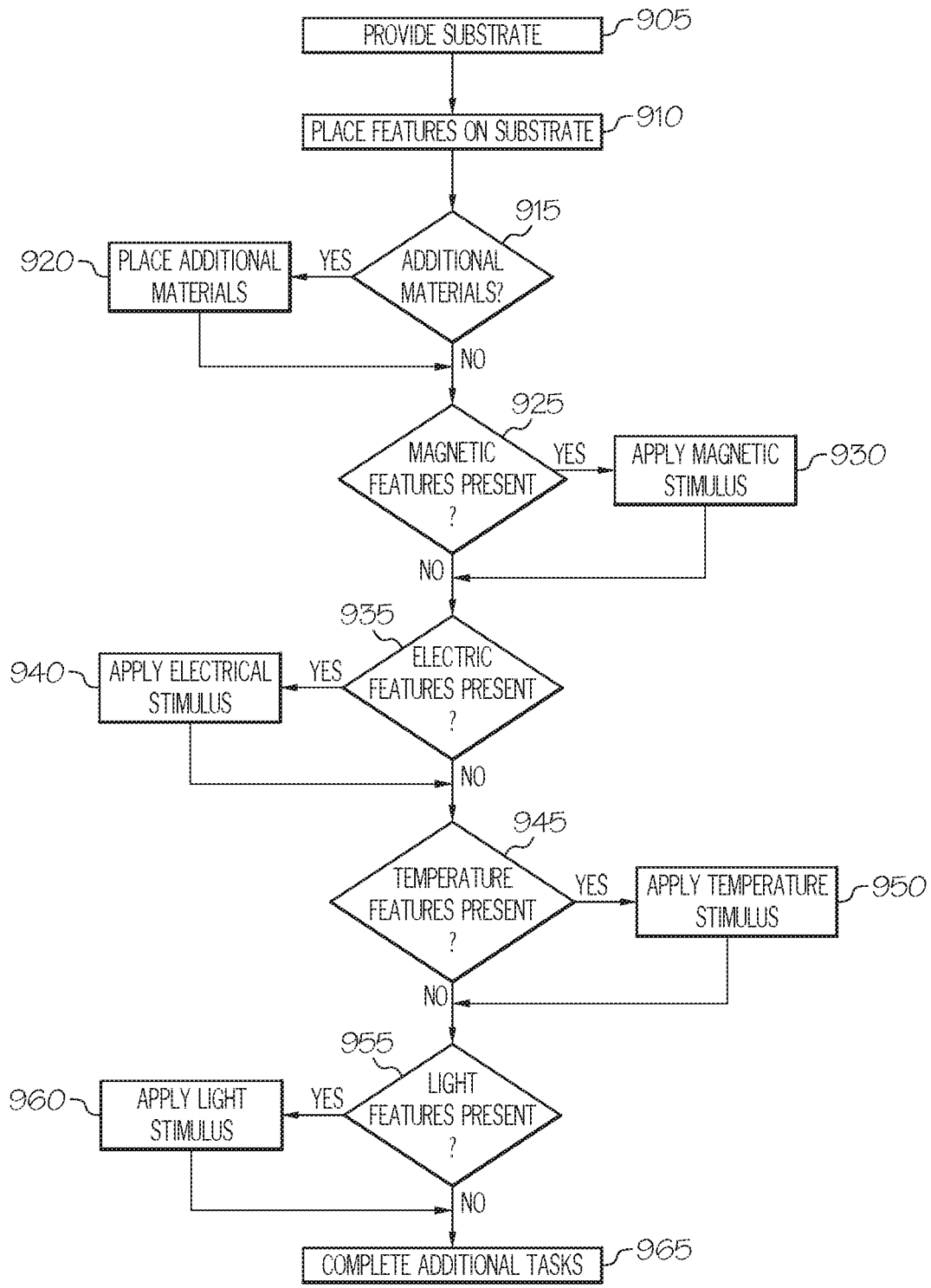
FIG. 9 depicts a flow diagram of an illustrative method of positioning and arranging a plurality of heat flow objects in the presence of an environmental stimulus according to one or more embodiments shown and described herein.

FIG. 9 depicts a flow diagram of an illustrative method of arranging one or more heat flow objects according to various embodiments. The method may include providing 905 a substrate, such as, for example, any substrate described in greater detail herein. One or more features may be placed 910 on the substrate. For example, in some embodiments, a self-assembling material may be placed 910 on the substrate. In some embodiments, features that respond to one or more environmental stimuli (e.g., magnetic stimulus, electrical stimulus, temperature stimulus, and light stimulus) may be placed 910 on the substrate. In some embodiments, placing 910 the one or more features on the substrate may further include arranging the one or more features with respect to each other and/or the substrate such that at least one of the one or more features is configured to respond to an environmental stimulus, as described in greater detail herein. In some embodiments, placing 910 the one or more features on the substrate may further include affixing the one or more features to the substrate. Affixing the one or more features to the substrate is not limited by this disclosure and may generally include any means of fixture now known or later developed. In some embodiments, a determination 915 of whether additional materials are needed, and if so, the additional materials may be placed 920 on the substrate and/or on the features.

In various embodiments, one or more determinations may be made as to the types of features that are present on the substrate so as to apply the appropriate environmental stimulus to cause an arrangement from an undeployed state to a deployed state or vice-versa, as described in greater detail herein. For example, a determination 925 of whether any of the features will respond to magnets and/or a magnetic field may be made. If any of the features will respond to magnets and/or a magnetic field, a magnetic stimulus may be applied 930. Application 930 of a magnetic stimulus may include application of a magnetic field, affixing a magnet to the substrate, and/or the like. Another determination 935 of whether any of the features will respond to an electric current and/or an electric field may be made. If any of the features will respond to an electric current and/or an electric field, an electrical stimulus may be applied 940. Application 940 of the electrical stimulus may include, for example, attaching electrodes to the one or more features and/or the substrate, introducing the one or more features and/or the substrate to an electric field, and/or the like. Another determination 945 of whether any of the features will respond to temperature change may be made. If any of the features will respond to a temperature change, a temperature stimulus may be applied 950 or a temperature change may be induced. Applying 950 the temperature stimulus may include heating or cooling the one or more features by any means of heating or cooling now known or later developed. Another determination 955 of whether any of the features will respond to illumination may be made. If any of the features will respond to illumination, an illumination stimulus may be applied 960 or illumination may be induced. Applying 960 the illumination stimulus may include applying a particular wavelength of light, as described in greater detail herein. Additional processing tasks 965 may also be completed, such as, for example, other manufacturing steps, cutting the substrate, arranging the substrate, other post-processing steps, and/or the like.

Figure 10:
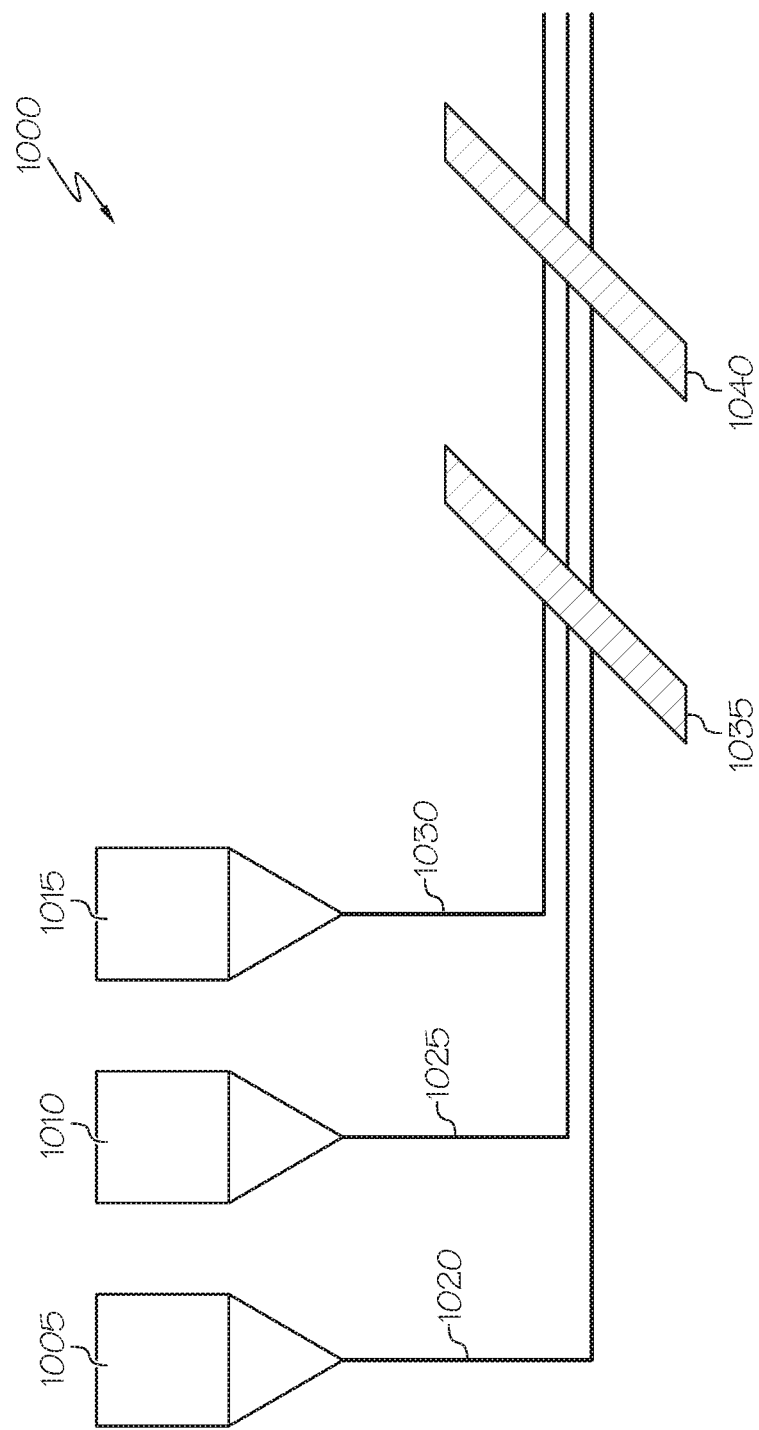
FIG. 10 depicts an illustrative schematic diagram of an apparatus for assembling the heat flow objects containing the self-assembling material according to one or more embodiments shown and described herein.

FIG. 10 depicts an illustrative schematic diagram of an apparatus for providing a substrate, placing one or more features, and/or placing one or more additional materials. In some embodiments, the apparatus depicted in FIG. 10 may be known as a three-dimensional printing (or 3D printing)

apparatus. In other embodiments, the apparatus depicted in FIG. 10 may be known as a four-dimensional printing (or 4D printing apparatus).

As shown in FIG. 10, the apparatus, generally designated 1000, may include a plurality of print nozzles 1005, 1010, 1015. A first print nozzle 1005 may contain a first material 1020, such as, for example, a first substrate material. The first substrate material may be, for example, a high thermally conductive material exhibiting high stiffness properties. A material having high thermally conductive properties may generally be any material having a thermal conductivity that is greater than or equal to about 10 W/m-K (at 300 K). Illustrative examples of materials having high thermally conductive properties may include ceramic materials such as aluminum nitride, sintered a silicon carbide, and/or the like. As the first material 1020 may exhibit high stiffness, it may have a high elastic modulus or high Young's modulus. A nonlimiting example of a high Young's modulus may be, for example, a Young's modulus that is greater than or equal to about 1 kg/mm$^2$ or a Young's modulus that is greater than or equal to about 50 gigapascals (GPa). In some embodiments, the first material 1020 may be a substrate material containing one or more shape memory materials, such as the shape memory materials described herein.

A second print nozzle 1010 may contain a second material 1025, such as, for example, a second substrate material or a material containing additional components, such as the components described in greater detail herein. In some embodiments, the second material 1025 may be a low thermally conductive material exhibiting high stiffness properties. A material having low thermally conductive properties may generally be any material having a thermal conductivity that is less than about 10 W/m-K (at 300 K). As the second material 1025 may exhibit high stiffness properties, the second material 1025 may be a material having a high elastic modulus or high Young's modulus, such as, for example, a Young's modulus that is greater than or equal to about 1 kg/mm$^2$ or a Young's modulus that is greater than or equal to about 50 GPa.

A third print nozzle 1015 may contain a third material 1030, such as, for example, a material that responds to an environmental stimulus such as the environmental stimuli described herein. In some embodiments, the third material 1030 may be a shape memory material, such as the shape memory materials described herein. In some embodiments, the third material 1030 may have a low thermal conductivity. In some embodiments, the third material 1030 may exhibit low stiffness properties, which may correspond to a low elastic modulus or low Young's modulus, such as, for example, a Young's modulus that is less than about 1 kg/mm$^2$ or a Young's modulus that is less than about 50 gigapascals (GPa). In some embodiments, the third material 1030 may include a plurality of materials, each of which may respond to a different environmental stimulus. In other embodiments, the third material 1030 may be a material that responds in different ways based on the environmental stimulus. For example, the material may change shape in a first direction when exposed to a magnetic field and change shape in a second direction when heated. In some embodiments, particularly in embodiments where the first material 1020 contains a substrate material having one or more shape memory materials, the third print nozzle 1015 may be omitted.

The first nozzle 1005, the second nozzle 1010, and the third nozzle 1015 may respectively eject the first material 1020, the second material 1025, and the third material 1030, in a layered configuration such that the materials are stacked atop each other. For example, the first material 1020 may be a bottom layer and the third material 1030 may be a top layer, with the second material 1025 sandwiched between the first material and the third material.

In various embodiments, the first nozzle 1005, the second nozzle 1010, and the third nozzle 1015 may each be independently configured to control a flow of the respective material 1020, 1025, 1030 ejected therefrom. Thus, each of the first nozzle 1005, the second nozzle 1010, and the third nozzle 1015 may be independently configured to increase, decrease, or turn off the flow of the respective material 1020, 1025, 1030 ejected therefrom. Accordingly, in some embodiments, the nozzles 1005, 1010, 1015 may be programmed such that they selectively turn on and off at varying intervals to build up various layers having different properties. Such a build up may allow the resultant heat flow objects to have certain properties, thereby allowing the heat flow objects to respond to varying environmental stimuli, as described in greater detail herein. In a nonlimiting example, the first nozzle 1005 and the third nozzle 1015 may eject the first material 1020 and the third material 1030, respectively, for a first period of time. After the first period of time has elapsed, the second nozzle 1010 may activate to eject the second material 1025 such that all three nozzles eject all three materials for a second period of time. After the third period of time has elapsed, the third nozzle 1015 may reduce the flow of material 1030 therefrom so that the resulting heat flow object has a thinner layer of the third material.

The first material 1020, the second material 1025, and/or the third material 1030 may be passed through a pick and place device 1035, which may be configured to place discrete components on the materials. For example, in some embodiments, the pick and place device 1035 may be configured to place electrical or thermo-electric devices on the various materials. The pick and place device 1035 is not limited by this disclosure, and may generally be any device that can be configured to place components, such as, for example, a robotic arm.

In some embodiments, the resulting layered materials from the nozzles 1005, 1010, 1015 may generally be referred to as a 3D stack, which is the result of a 3D printing process. Such a 3D stack may be transformed into a 4D stack when subjected to an environmental stimulus that causes the stack to self-assemble, as described in greater detail herein. To cause the self-assembly, the first material 1020, the second material 1025, and/or the third material 1030 may be passed through an environmental stimulus device 1040. The environmental stimulus device 1040 may be configured to provide an environmental stimulus, such as an environmental stimulus described herein, to deploy a self-assembling heat flow object, as described in greater detail herein.

Figure 11:
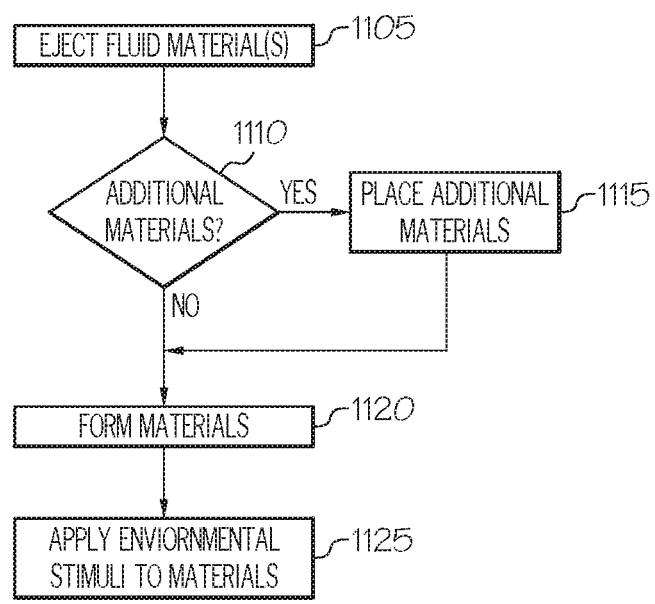
FIG. 11 depicts a flow diagram of an illustrative method of forming one or more heat flow objects, each containing the self-assembling material according to one or more embodiments shown and described herein.

FIG. 11 depicts a flow diagram of a method of using the apparatus of FIG. 10 to place and form the one or more features on a substrate. The fluid materials may be ejected 1105, such as through the nozzles described with respect to FIG. 10. A determination 1110 may be made as to whether additional materials should be placed. If so, the additional materials may be placed 1115 on the fluid materials. In some embodiments, the additional materials may be placed 1115 using the pick and place device described herein. In some embodiments, the materials may be formed 1120. Forming 1120 may include arranging the materials in preparation for deployment, cutting the materials into particular shapes, completing other postprocessing steps, and/or the like. In some embodiments, environmental stimuli may be applied 1125 to the materials to effect deployment, as described herein.

EXAMPLE

Forming a Heat Flow Device

A heat flow device that is used to direct heat away from hybrid engine components in a hybrid motor vehicle is formed using a 4-D printing process. The process includes an apparatus having 3 nozzles. The first nozzle contains a first liquid substrate material containing a high thermal conductivity and a high Young's modulus. Thus, the first substrate material, upon being ejected from the nozzle, hardens into a rigid material having a Young's modulus of about 50-90 gigapascals (GPa). The second nozzle contains a second liquid substrate material that contains a low thermal conductivity, but has the same high Young's modulus such that, when ejected, the second substrate material hardens on top of the first substrate material such that both materials combined have a Young's modulus of about 50-90 GPa. The third nozzle contains a heat activated shape memory polymer.

The three materials are ejected from their respective nozzles such that the first substrate is on the bottom, the second substrate is in the middle, and the shape memory polymer is on top. The materials are placed through a cutting device that divides the material into discrete shapes based on a final location for directing heat flow. The materials are placed, in an undeployed (crumpled) state, to create a plurality of heat flow devices for shielding, focusing, and guiding heat flux away from various components of the hybrid engine and toward a designated region. Because the heat flow devices are very small and cannot be accurately formed using robotics, the materials must be in the crumpled state so that they will fit. The materials are then heated, which causes them to uncrumple (deploy) to form tight fitting portions of the heat flow devices that are devoid of gaps between the portions. Accordingly, the heat flux will be appropriately shielded, focused, and guided in particular locations towards a target area that is a distance away from various heat generating components. In addition, the materials, when deployed, will arrange the thermoconducting elements on their respective surfaces such that the thermoconducting elements conduct thermal energy and focus and guide the heat flux away from the hybrid engine components.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A self-assembling heat flow object comprising:
   a material having one or more self-assembling properties that cause the material to be reactive to an environmental stimulus selected from at least one of a magnetic field, an electrical current, and an induced illumination; and
   one or more thermal pathways,
   wherein:
      application of the environmental stimulus causes the self-assembling heat flow object to deploy from an undeployed state to a deployed state where the self-assembling heat flow object is uncompacted and folded into a three dimensional shape to arrange the one or more thermal pathways for directing thermal energy, and
      the self-assembling heat flow object is disposed on a printed circuit board.

2. The self-assembling heat flow object of claim 1, further comprising a second material disposed on the material having the self-assembling properties, wherein the second material defines the one or more thermal pathways.

3. The self-assembling heat flow object of claim 2, wherein the second material is a thermally conductive material configured as a plurality of thermally conductive traces.

4. The self-assembling heat flow object of claim 1, wherein the environmental stimulus further comprises an induced temperature change.

5. The self-assembling heat flow object of claim 1, wherein the material is a ferromagnetic material, a diamagnetic material, or a paramagnetic material.

6. The self-assembling heat flow object of claim 1, wherein the material comprises at least one of iron, nickel, cobalt, copper, silver, gold, magnesium, molybdenum, lithium, and tantalum.

7. The self-assembling heat flow object of claim 1, wherein the material is an alloy comprising at least one of silver, copper, gold, aluminum, magnesium, molybdenum, zinc, lithium, tungsten, nickel, iron, cobalt, palladium, platinum, tin, lead, titanium, tantalum, and mercury.

8. The self-assembling heat flow object of claim 1, wherein the material comprises a shape memory polymer.

9. The self-assembling heat flow object of claim 1, wherein:
   the deployed state is a first deployed state; and
   an application of a second environmental stimulus causes the self-assembling heat flow object to arrange into a second deployed state to further arrange the one or more thermal pathways for directing the thermal energy to the one or more locations.

10. The self-assembling head flow object of claim 9, wherein an application of a third environmental stimulus causes the self-assembling heat flow object to arrange into a third deployed state to further arrange the one or more thermal pathways for directing the thermal energy to the one or more locations.

11. A method of forming a device configured to direct heat flow, the method comprising:
   placing one or more materials having one or more of self-assembling properties on a printed circuit board;
   providing one or more thermal pathways by placing a thermally conductive material on the one or more materials to form a self-assembling heat flow object; and
   causing an environmental stimulus such that the one or more materials deploy from an undeployed state where the self-assembling heat flow object is compacted to a deployed state where the self-assembling heat flow object is uncompacted and folded into a three dimensional shape to arrange the one or more thermal pathways for movement of heat at one or more locations adjacent to the device, wherein the environmental stimulus is selected from at least one of an introduction of a magnetic field adjacent to the self-assembling heat flow object, an introduction of an electrical current to the self-assembling heat flow object, and an illumination of the self-assembling heat flow object.

12. The method of claim 11, wherein causing the environmental stimulus is further selected from a heating or a cooling of the substrate.

13. The method of claim 11, further comprising:
applying a second environmental stimulus such that the one or more materials deploy from the deployed state to a second deployed state to further arrange the one or more thermal pathways for movement of heat.

14. The method of claim 13, further comprising:
applying a third environmental stimulus such that the one or more materials deploy from the second deployed state to a third deployed state to further arrange the one or more thermal pathways for movement of heat.

15. A device configured to direct heat flow, the device comprising:
a plurality of self-assembling heat flow objects disposed on a printed circuit board, each one of the plurality of self-assembling heat flow objects comprising:
a shape memory material disposed on the printed circuit board, wherein the shape memory material comprises one or more self-assembling properties that cause the shape memory material to be reactive to an environmental stimulus selected from at least one of an introduction of a magnetic field adjacent to the self-assembling heat flow object, an introduction of an electrical current, and an induced illumination; and
one or more thermal pathways,
wherein an application of the environmental stimulus causes the plurality of self-assembling heat flow objects to deploy from an undeployed state where the plurality of self-assembling heat flow objects are compacted to a deployed state where each one of the plurality of self-assembling heat flow objects are uncompacted and folded into a three dimensional shape to arrange the one or more thermal pathways for directing thermal energy to one or more locations adjacent to the self-assembling heat flow object.

16. The device of claim 15, further comprising a second material disposed on the shape memory material having the self-assembling properties, wherein the second material comprises the one or more thermal pathways.

17. The device of claim 16, wherein the second material is a thermally conductive material.

* * * * *